United States Patent
Sakumoto

(10) Patent No.: US 12,476,159 B2
(45) Date of Patent: Nov. 18, 2025

(54) SEMICONDUCTOR DEVICE

(71) Applicant: Mitsubishi Electric Corporation, Tokyo (JP)

(72) Inventor: Shotaro Sakumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 546 days.

(21) Appl. No.: 17/822,049

(22) Filed: Aug. 24, 2022

(65) Prior Publication Data

US 2023/0154814 A1     May 18, 2023

(30) Foreign Application Priority Data

Nov. 16, 2021   (JP) .................. 2021-186172

(51) Int. Cl.
| | |
|---|---|
| H01L 23/053 | (2006.01) |
| H01L 23/31 | (2006.01) |
| H01L 23/498 | (2006.01) |
| H01L 23/00 | (2006.01) |

(52) U.S. Cl.
CPC .... *H01L 23/3121* (2013.01); *H01L 23/49811* (2013.01); *H01L 23/49822* (2013.01); *H01L 23/49866* (2013.01); *H01L 24/32* (2013.01); *H01L 24/45* (2013.01); *H01L 24/48* (2013.01); *H01L 24/73* (2013.01); *H01L 24/83* (2013.01); *H01L 2224/32225* (2013.01); *H01L 2224/45124* (2013.01); *H01L 2224/48175* (2013.01);
(Continued)

(58) Field of Classification Search
CPC ...... H01L 24/32; H01L 23/053; H01L 23/488
See application file for complete search history.

(56) References Cited

U.S. PATENT DOCUMENTS 6,313,598 B1 *  11/2001  Tamba ............... H01L 23/4334
                                                       361/728
2007/0246833 A1 *  10/2007  Soga ..................... H01L 23/24
                                                       257/772

(Continued)

FOREIGN PATENT DOCUMENTS

| | | |
|---|---|---|
| DE | 10 2020 207 954 A1 | 3/2021 |
| JP | H05-102381 A | 4/1993 |

(Continued)

OTHER PUBLICATIONS

An Office Action mailed by the Japanese Patent Office on Sep. 3, 2024, which corresponds to Japanese Patent Application No. 2021-186172 and is related to U.S. Appl. No. 17/822,049.

(Continued)

*Primary Examiner* — Michele Fan
(74) *Attorney, Agent, or Firm* — Studebaker Brackett PLLC

(57) ABSTRACT

An object is to provide a technique for suppressing solder from peeling from a copper block. A copper block is bonded on a copper pattern via first solder and an electrode terminal is bonded on the copper block via second solder. The sealing resin covers the copper pattern, the first solder, the copper block, the second solder, the electrode terminal, and the semiconductor element. The area of the portion of the copper block bonded by the first solder is greater than the area of the portion of the copper block bonded by the second solder.

9 Claims, 2 Drawing Sheets

(52) U.S. Cl.
    CPC ............... *H01L 2224/73265* (2013.01); *H01L 2224/83447* (2013.01)

(56)          References Cited

U.S. PATENT DOCUMENTS

| 2015/0116968 | A1* | 4/2015 | Yamada ............ H01L 23/49894 |
| | | | 361/767 |
| 2018/0350710 | A1* | 12/2018 | Iwahashi .................. H01L 23/29 |
| 2020/0286840 | A1* | 9/2020 | Kaji ........................ H01L 25/18 |
| 2021/0090974 | A1 | 3/2021 | Matsuo et al. |
| 2022/0181310 | A1 | 6/2022 | Wu et al. |
| 2022/0415748 | A1 | 12/2022 | Tanaka |

FOREIGN PATENT DOCUMENTS

| JP | 2011142124 A | * | 7/2011 |
| JP | 2013-038259 A | | 2/2013 |
| JP | 2013-131592 A | | 7/2013 |
| JP | 2018152444 A | * | 9/2018 |
| WO | 2020/241346 A1 | | 12/2020 |
| WO | 2021/152795 A1 | | 8/2021 |

OTHER PUBLICATIONS

An Office Action; "Decision of Refusal," mailed by the Japanese Patent Office on Jan. 7, 2025, which corresponds to Japanese Patent Application No. 2021-186172 and is related to U.S. Appl. No. 17/822,049; with English language translation.

An Office Action issued by the German Patent and Trademark Office on Sep. 30, 2025, which corresponds to German Patent Application No. 102022124463.6 and is related to U.S. Appl. No. 17/822,049; with English language translation.

* cited by examiner

SEMICONDUCTOR DEVICE

BACKGROUND OF THE INVENTION

Field of the Invention

The present disclosure relates to a semiconductor device.

Description of the Background Art

As a semiconductor device such as a power semiconductor device, a semiconductor device in which a semiconductor element and a copper block, which is a relatively thick conductive block, are sealed with a sealing resin has been proposed (for example, Japanese Patent Application Laid-Open No. 2013-131592).

SUMMARY

A semiconductor device is required to operate under a high temperature environment. However, when the sealing resin for high temperature operation is cured during the manufacturing process, the temperature difference from the temperature at the start of curing to the room temperature is large, so that the stress of thermal expansion and contraction of the sealing resin becomes relatively large. Therefore, the stress of the sealing resin is concentrated on the solder used for bonding the copper block, and the solder could peel off from the copper block.

The present disclosure has been made in view of the aforementioned issues, and it is an object thereof is to provide a technique that ensures to suppress the solder from peeling off from the copper block.

The semiconductor device according to the present disclosure includes a copper pattern, a copper block bonded on the copper pattern via first solder, an electrode terminal bonded on the copper block via second solder, a semiconductor element electrically connected to the copper pattern, and a sealing resin covering the copper pattern, the first solder, the copper block, the second solder, the electrode terminal, and the semiconductor element. An area of a portion of the copper block bonded by the first solder is greater than an area of a portion of the copper block bonded by the second solder.

Peeling of the solder from the copper block is suppressed.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
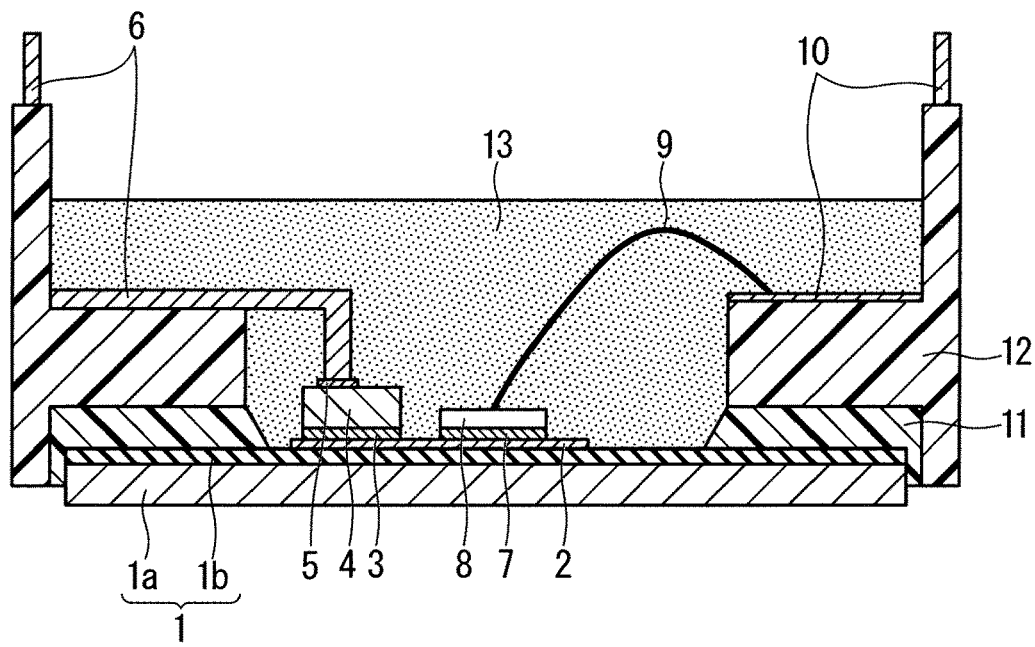
FIG. 1 is a cross-sectional view illustrating a configuration of a semiconductor device according to a first embodiment.

Hereinafter, the embodiments will be described with reference to the attached drawings. The features described in each of the following embodiments are exemplary and not all features are required. Further, in the description to be made below, similar components are designated by the same or similar reference numerals in a plurality of embodiments, and different components will be mainly described. Also in the description described below, when terms specifying specific positions and directions such as "up", "low", "left", "right", "front", "back" and the like do not necessarily coincide with the positions and directions at the time of implementation.

First Embodiment

FIG. 1 is a cross-sectional view illustrating a configuration of a semiconductor device according to the first embodiment. The semiconductor device of FIG. 1 includes an insulating base substrate 1, a copper pattern 2, first solder 3, a copper block 4, second solder 5, an electrode terminal 6, third solder 7, a semiconductor element 8, a wire 9, an electrode terminal 10, an adhesive member 11, a case 12, and a sealing resin 13.

The insulating base substrate 1 includes a copper base plate 1a and a resin insulating layer 1b. The resin insulating layer 1b is provided on the copper base plate 1a and is integrated with the copper base plate 1a.

The copper pattern 2 is provided on the resin insulating layer 1b. Note that the copper pattern 2 may be included in the insulating base substrate 1.

The copper block 4 is bonded on the copper pattern 2 via the first solder 3. In the first embodiment, the thickness of the copper block 4 is greater than the thickness of the copper pattern 2.

The electrode terminal 6 is bonded on the copper block 4 via the second solder 5. The area of the portion of the copper block 4 bonded by the first solder 3 is greater than the area of the portion of the copper block 4 bonded by the second solder 5.

The semiconductor element 8 includes at least one of a semiconductor switching element and a diode. A semiconductor switching element is, for example, an Insulated Gate Bipolar Transistor (IGBT), an Reverse Conducting-IGBT (RC-IGBT), and a Metal Oxide Semiconductor Field Effect Transistor (MOSFET), and a diode is, for example, a PN junction Diode (PND), and a Schottky Barrier Diode (SBD). Hereinafter, a case where the semiconductor element 8 is a semiconductor switching element will be described as an example.

The material of the semiconductor element 8 may include regular silicon (Si) or a wide band gap semiconductor such as silicon carbide (SiC), gallium nitride (GaN), or diamond. The case of the material of the semiconductor element 8 being a wide band gap semiconductor enables the stable operation under high temperature and high voltage and the raising of the switching speed.

The semiconductor element 8 is electrically connected to the copper pattern 2. In the first embodiment, the semiconductor element 8 is electrically connected to the copper pattern 2 by being bonded to the copper pattern 2 via the third solder 7. With this configuration, the semiconductor element 8 is electrically connected to the copper block 4 and the electrode terminal 6 via the copper pattern 2, and the electrode terminal 6 functions as, for example, a collector electrode of the semiconductor element 8.

The semiconductor element 8 is electrically connected to an electrode terminal 10 via the wire 9, and the electrode terminal 10 functions as, for example, an emitter electrode of the semiconductor element 8. The material of the wire 9 is aluminum, for example. Connection of the wire 9 and bonding of the first solder 3, the second solder 5, and the third solder 7 forms a circuit in a space surrounded by a case 12.

The case 12 is adhered to the end portion of the insulating base substrate 1 by an adhesive member 11. The material of the case 12 is an insulating resin, for example. In the example of FIG. 1, the central portion of the electrode terminal 6 and the central portion of the electrode terminal 10 are embedded in the case 12.

The sealing resin 13 is filled in the space surrounded by the case 12, and covers the copper pattern 2, the first solder 3, the copper block 4, the second solder 5, the electrode terminal 6, the semiconductor element 8, and the like. The sealing resin 13 has a glass-transition temperature (Tg) exceeding the operating temperature of the semiconductor element 8.

Summary of First Embodiment

In the semiconductor device according to the first embodiment, the area of the portion of the copper block 4 bonded by the first solder 3 is greater than the area of the portion of the copper block 4 bonded by the second solder 5. According to such a configuration, the bonded area between the first solder 3 and the copper block 4 is relatively large; therefore, peeling of the first solder 3 from the copper block 4 is suppressed.

Meanwhile, the second solder 5 is located closer to the upper surface of the sealing resin 13 than the first solder 3 is. The closer to the upper surface of the sealing resin 13, the more the stress of the sealing resin 13 can be released to the space above the sealing resin 13, so that the stress applied to the second solder 5 from the sealing resin 13 is lower than the stress applied to the first solder 3 from the sealing resin 13. Therefore, even if the bonding area between the second solder 5 and the copper block 4 is relatively small, peeling of the second solder 5 from the copper block 4 is suppressed.

In the first embodiment, the thickness of the copper block 4 is greater than the thickness of the copper pattern 2. According to such a configuration, the second solder 5 can be brought closer to the upper surface of the sealing resin 13 so that the peeling of the second solder 5 from the copper block 4 is further suppressed. Further, the contact area between the copper block 4 and the sealing resin 13 is relatively large; therefore, peeling of the sealing resin 13 from the copper block 4 is suppressed.

Second Embodiment

Figure 2:
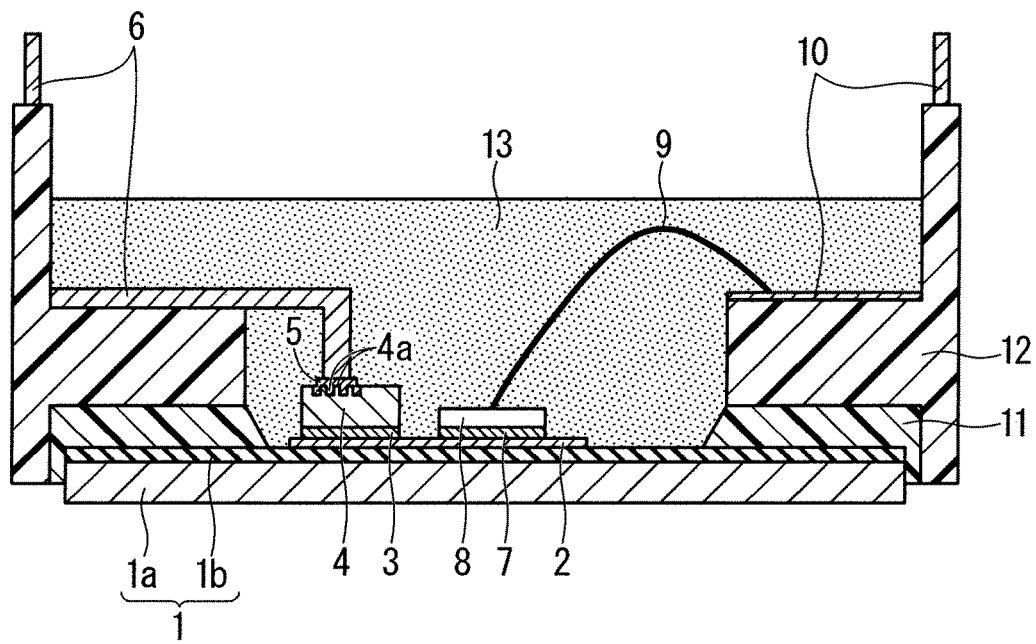
FIG. 2 is a cross-sectional view illustrating a configuration of a semiconductor device according to a second embodiment.

FIG. 2 is a cross-sectional view illustrating a configuration of a semiconductor device according to the second embodiment. In the second embodiment, an uneven portion 4a is provided in the surface of the copper block 4 which is bonded by the second solder 5. That is, the surface of the copper block 4 which is bonded by the second solder 5 is roughened.

The range of the uneven portion 4a may be a range in which the second solder 5 wets, for example, a circular range having a diameter of 200 to 300 μm, or a rectangular range having a side of 200 to 300 μm. A step of the uneven portion 4a is, for example, about 200 μm, and for the formation of the uneven portion 4a, for example, router processing is adopted. Except for the above points, the configuration of the second embodiment is the same as the configuration of the first embodiment.

According to the semiconductor device of the second embodiment as described above, the same effect as that of the first embodiment can be obtained. Further, in the second embodiment, the uneven portion 4a of the copper block 4 causes an anchor effect between the second solder 5 and the copper block 4, so that peeling of the second solder 5 from the copper block 4 is suppressed.

Although not illustrated, the surface of the electrode terminal 6 which is bonded by the second solder 5 may also be provided with an uneven portion to suppress the second solder 5 from peeling from the electrode terminal 6.

Third Embodiment

Figure 3:
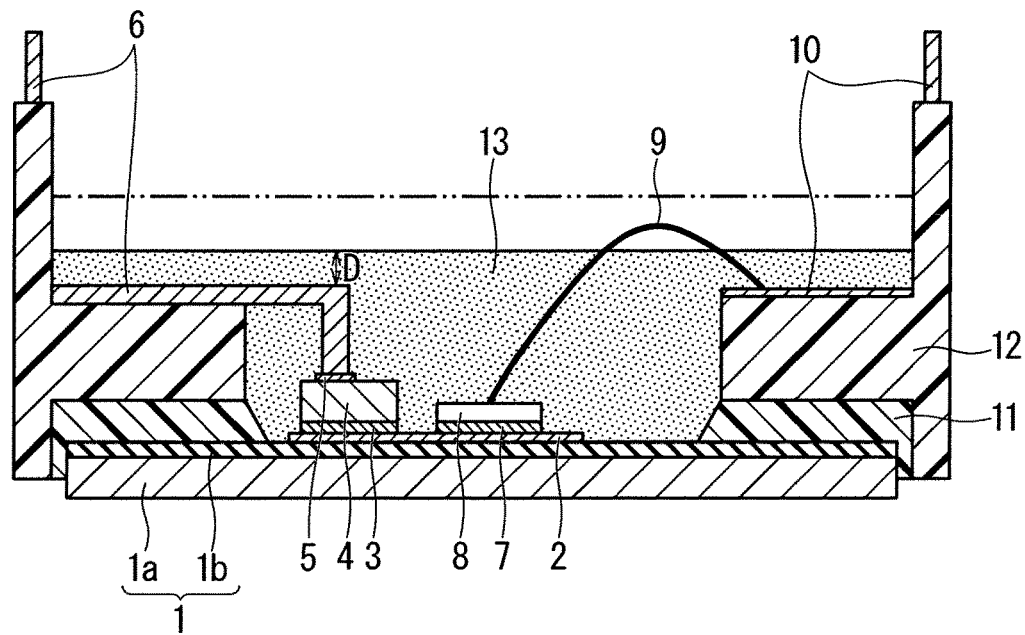
FIG. 3 is a cross-sectional view illustrating a configuration of a semiconductor device according to a third embodiment.

FIG. 3 is a cross-sectional view illustrating a configuration of a semiconductor device according to the third embodiment. In FIG. 3, the position of the upper surface of the sealing resin 13 of the first embodiment is illustrated by a two-dot chain line. In the third embodiment, a thickness D of the sealing resin 13 on the portion of the electrode terminal 6 which is bonded by the second solder 5 is 2.0 mm or more and 2.5 mm or less. That is, the thickness D from the upper portion of the electrode terminal 6 which is not in contact with the second solder 5 to the upper surface of the sealing resin 13 is 2.0 mm or more and 2.5 mm or less, which is relatively thin. Except for the above points, the configuration of the third embodiment is the same as the configuration of the first embodiment.

According to the semiconductor device of the third embodiment as described above, the same effect as that of the first embodiment can be obtained. Further, in the third embodiment, the thickness D of the sealing resin 13 on the portion of the electrode terminal 6 which is bonded by the second solder 5 is relatively thin so that the stress applied to the second solder 5 from the sealing resin 13 is reduced and peeling of the second solder 5 from the copper block 4 is suppressed. Further, the curing of the sealing resin 13 promoted. The configuration of the third embodiment may also be applied to the second embodiment.

Fourth Embodiment

Figure 4:
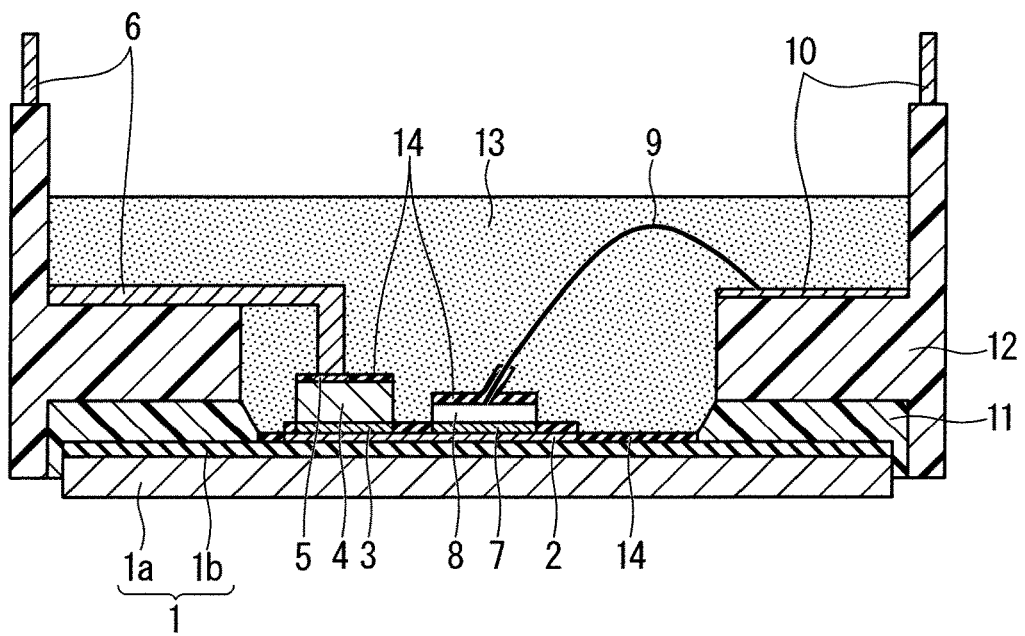
FIG. 4 is a cross-sectional view illustrating a configuration of a semiconductor device according to a fourth embodiment.

FIG. 4 is a cross-sectional view illustrating a configuration of a semiconductor device according to the fourth embodiment. In the fourth embodiment, a coating film 14 is provided between the copper block 4 and the sealing resin 13. In the example of FIG. 4, the coating film 14 is also provided between the sealing resin 13 and each of the resin insulating layer 1b, the copper pattern 2, the semiconductor element 8, and the wire 9. The material of the coating film 14 is, for example, polyimide, and the thickness of the coating film 14 is, for example, 100 nm or less. The thermal expansion coefficient of the coating film 14 is preferably equivalent to the thermal expansion coefficient of copper. Except for the above points, the configuration of the fourth embodiment is the same as the configuration of the first embodiment.

According to the semiconductor device of the fourth embodiment as described above, the same effect as that of the first embodiment can be obtained. Further, in the fourth embodiment, the coating film 14 enhances the adhesion between the copper block 4 and the sealing resin 13; therefore, peeling of the sealing resin 13 from the copper block 4 is suppressed. According to the configuration as illustrated in FIG. 4, peeling of the sealing resin 13 from the resin insulating layer 1b, the copper pattern 2, the semiconductor element 8, and the wire 9 is suppressed. The configuration of the fourth embodiment may also be applied to the second and third embodiments.

The embodiments and the modifications can be combined, and the embodiments and the modifications can be appropriately modified or omitted.

While the disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
   a copper pattern;
   a copper block bonded on the copper pattern via first solder;
   an electrode terminal bonded on the copper block via second solder;
   a semiconductor element electrically connected to the copper pattern; and
   a sealing resin covering the copper pattern, the first solder, the copper block, the second solder, the electrode terminal, and the semiconductor element, wherein
   an area of a portion of the copper block bonded by the first solder is greater than an area of a portion of the copper block bonded by the second solder, and
   the semiconductor device further comprises a wire connected to the semiconductor element, and an upper end of the sealing resin on a portion of the electrode terminal which is bonded by the second solder is located lower than the highest portion of the wire.

2. The semiconductor device according to claim 1, wherein
   a thickness of the copper block is greater than a thickness of the copper pattern.

3. The semiconductor device according to claim 1, wherein
   a surface of the copper block which is bonded by the second solder is provided with an uneven portion.

4. The semiconductor device according to claim 1, wherein
   a thickness of the sealing resin on a portion of the electrode terminal which is bonded by the second solder is 2.0 mm or more and 2.5 mm or less.

5. The semiconductor device according to claim 1, further comprising
   a coating film provided between the copper block and the sealing resin.

6. The semiconductor device according to claim 1, wherein
   the copper block is directly bonded on the copper pattern via the first solder, and the electrode terminal is directly bonded on the copper block via the second solder.

7. The semiconductor device according to claim 1, wherein
   the semiconductor element is electrically connected to the copper block via the copper pattern,
   the copper block is bonded on top of the copper pattern via the first solder, and
   the electrode terminal is bonded on top of the copper block via the second solder.

8. The semiconductor device according to claim 1, wherein the semiconductor element is directly electrically connected to the copper pattern via third solder.

9. The semiconductor device according to claim 1, wherein the area of the portion of the copper block bonded by the first solder is directly bonded to the first solder, and the area of the portion of the copper block bonded by the second solder is directly bonded to the second solder.

* * * * *